United States Patent
Miles et al.

(10) Patent No.: US 7,839,171 B1
(45) Date of Patent: Nov. 23, 2010

(54) DIGITAL LEVEL SHIFTER AND METHODS THEREOF

(75) Inventors: Tommy Miles, Fort Collins, CO (US);
Aaron K. Horiuchi, Thornton, CO (US);
Chuck P. Tung, Westford, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/468,385

(22) Filed: May 19, 2009

(51) Int. Cl.
*H03K 19/0185* (2006.01)
*H03K 19/0175* (2006.01)
(52) U.S. Cl. .......................... 326/80; 326/63; 327/333
(58) Field of Classification Search ................. 326/80, 326/81, 63, 68; 327/333, 215
See application file for complete search history.

(56) References Cited

U.S. PATENT DOCUMENTS 6,946,893 B2 * 9/2005 Hayashi et al. ............. 327/333
2003/0042965 A1 * 3/2003 Kanno et al. ............... 327/333

OTHER PUBLICATIONS

Mark Horenstein, "Microelectronic Circuits & Devices", 1990, Prentice-Hall, Inc, p. 753.*

* cited by examiner

*Primary Examiner*—Daniel D Chang

(57) ABSTRACT

A digital level shifter is disclosed that receives an input voltage from a first voltage domain, and provides an output voltage to a second voltage domain. The level shifter includes transistors configured in parallel with input transistors of the level shifter in order to place the output of the level shifter in a determinate state when one of the voltage domains is placed in a low power state. Further, the level shifter includes output transistors configured to equalize a rise time slew rate and fall time slew rate, improving the reliability of the level shifter as the voltage in each voltage domain varies.

12 Claims, 2 Drawing Sheets

US 7,839,171 B1

DIGITAL LEVEL SHIFTER AND METHODS THEREOF

BACKGROUND

1. Field of the Disclosure

The present disclosure relates generally to electronic devices, and more particularly to level shifters for electronic devices.

2. Description of the Related Art

Logic modules of electronic devices, such as integrated circuit devices, typically employ a reference voltage that determines the high-level voltage representing a logic level at the module. When logic modules that have different reference voltages need to communicate with each other, a level shifter can provide an interface between the modules having different voltage references. The use of a level shifter allows a module in one voltage domain (e.g. a module having a lower voltage reference, referred to as a low-reference module), to interface with a module in another voltage domain (e.g. a module having a higher voltage reference, referred to as a high-reference module). The level shifter translates the voltage signal from the module in one voltage domain to a voltage signal having a magnitude sufficient to represent the appropriate logic state at the module in the other voltage domain. However, some conventional level shifters can operate unpredictably when one of the voltage domains is placed in a low power state. Such unpredictability can make device testing difficult, as well as cause undesirable power loss.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A digital level shifter is disclosed that receives an input voltage from a first voltage domain, and provides an output voltage to a second voltage domain. The level shifter includes transistors configured in parallel with input transistors of the level shifter in order to place the output of the level shifter in a determinate state when one of the voltage domains is placed in a low power state. Further, the level shifter includes output transistors configured to equalize a rise time slew rate and fall time slew rate, improving the reliability of the level shifter as the voltage in each voltage domain varies.

Figure 1:
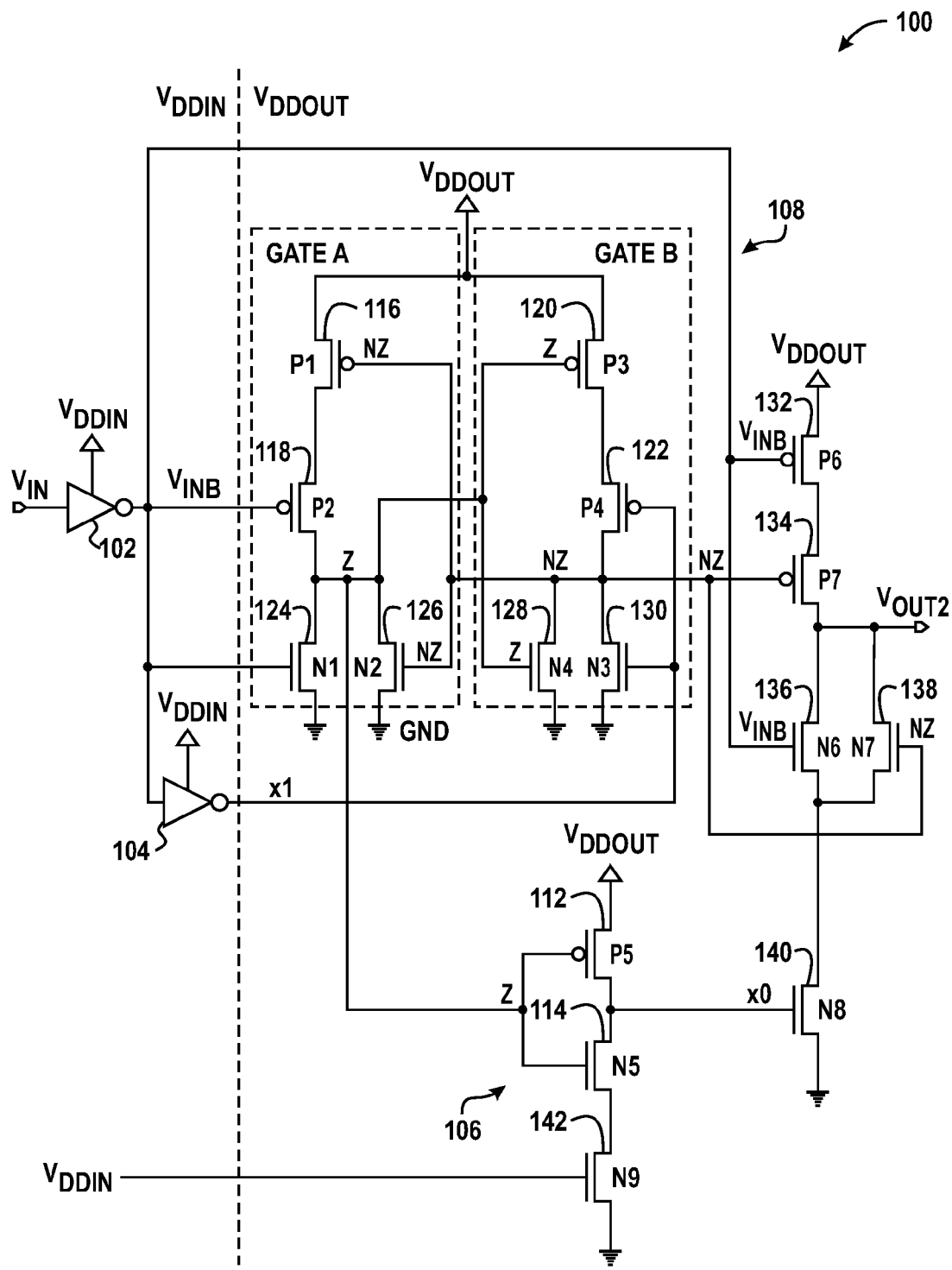
FIG. 1 is a circuit diagram illustrating a level shifter in accordance with one embodiment of the present disclosure.

FIG. 1 shows a schematic diagram of a level shifter 100 including inverters 102, 104, and 106, and a latch 108. The inverter 106 includes a p-type transistor 112 and an n-type transistor 114. The latch 108 includes p-type transistors 116, 118, 120, and 122, and n-type transistors 124, 126, 128, and 130. The level shifter 100 also includes p-type transistors 132 and 134, and n-type transistors 136, 138, and 140. The inverter 102 includes an input terminal connected to an input voltage signal, labeled "$V_{IN}$," and an output terminal for providing an output voltage, labeled "$V_{INB}$." The inverter 104 includes an input terminal connected to the output terminal of the inverter 102, and an output terminal for providing an output signal, labeled "x1."

Transistor 112 has a first current electrode connected to a first voltage reference, labeled "$V_{DDOUT}$", a second current electrode, and a control electrode connected to a node "Z." Transistor 114 has a first current electrode connected to the second current electrode of transistor 112, a second current electrode, and a control electrode connected to the control electrode of transistor 112. Transistor 116 has a first current electrode connected to the first voltage reference, a second current electrode, and a control electrode connected to a node "NZ." Transistor 118 has a first current electrode connected to the second current electrode of transistor 116, a second current electrode connected to the control electrode of transistor 112, and a control electrode connected to the output terminal of the inverter 102. Transistor 120 includes a first current electrode connected to the first voltage reference, a second current electrode, and a control electrode connected to the second current electrode of transistor 118. Transistor 122 includes a first current electrode connected to the second current electrode of transistor 120, a second current electrode connected to the control electrode of transistor 116, and a control electrode connected to the output terminal of the inverter 104.

Transistor 124 includes a first current electrode connected to the second current electrode of transistor 118, a second current electrode connected to a second voltage reference, labeled GND, and a control electrode connected to the output terminal of inverter 102. Transistor 126 includes a first current electrode connected to the first current electrode of transistor 124, a second current electrode connected to the second voltage reference, and a control electrode connected to the second current electrode of transistor 122. Transistor 128 includes a first current electrode connected to the second current electrode of transistor 122, a second current electrode connected to the second voltage reference, and a control electrode connected to the first current electrode of transistor 124. Transistor 130 includes a first current electrode connected to the second current electrode of transistor 122, a second current electrode connected to the second voltage reference, and a control electrode connected to the output terminal of the inverter 104.

Transistor 132 includes a first current electrode connected to the first voltage reference, a second current electrode, and a control electrode connected to the output terminal of the inverter 102. Transistor 134 includes a first current electrode connected to the second current electrode of transistor 132, a second current electrode for providing an output voltage, labeled $V_{OUT2}$, and a control electrode connected to the first current electrode of transistor 130. Transistor 136 includes a first current electrode connected to the second current electrode of transistor 134, a second current electrode, and a control electrode connected to the output terminal of the inverter 102. Transistor 138 includes a first current electrode connected to the first current electrode of transistor 136, a second current electrode connected to the second current electrode of transistor 136, and a control electrode connected to the first current electrode of transistor 130. Transistor 140 includes a first current electrode connected to the second current electrode of transistor 136, a second current electrode connected to the second voltage reference, and a control electrode connected to the second current electrode of transistor 112. Transistor 142 includes a first current electrode connected to the second current electrode of transistor 114, a second current electrode connected to the second voltage reference, and a control electrode connected to a third voltage reference, labeled $V_{DDIN}$.

For purposes of discussion, it is assumed that the level shifter 100 is employed as part of a device, such as data processing device, such that the $V_{DDIN}$ voltage domain can be placed in different power modes. In particular, the VDDIN voltage domain can be placed in an active, or normal, mode where VDDIN is set to a nominal level to allow normal operations in the voltage domain. There is a common GND or VSS reference level shared between reference voltages VDDOUT and VDDIN. The lower voltage level can go as low as common ground or VSS. In addition, the VDDIN, voltage domain can be placed in a low-power mode, where the VDDIN voltage is reduced to a lower level relative (greater than or equal to the GND) to the voltage in the active mode.

In the active mode, the level shifter 100 receives the input signal $V_{IN}$ from a module employing $V_{DDIN}$ as a reference voltage and uses the signal to produce the output signal $V_{OUT2}$ to a module that employs $V_{DDOUT}$ as a reference voltage. In one embodiment, the output signal $V_{OUT2}$ has a higher high-level voltage magnitude than the high-level voltage magnitude of the input signal $V_{IN}$. In another embodiment, the output signal $V_{OUT2}$ has a lower high-level voltage magnitude than the high-level voltage magnitude of the input signal $V_{IN}$. In particular embodiments, the specified high-level magnitude of the input signal $V_{IN}$ can be substantially less than or greater than the voltage reference $V_{DDOUT}$.

To illustrate operation of the level shifter 100 when $V_{DDIN}$ is in the active mode, it is assumed for purposes of discussion that the input signal $V_{IN}$ is in a steady state of operation with the magnitude of the input signal $V_{IN}$ at a low-level voltage, such as ground, that represents a logic state. The inverter 102 provides a complement of signal $V_{IN}$ as signal $V_{INB}$. Therefore, $V_{INB}$ is at a high-level voltage representing a complementary logic state of the low-reference module. The signal $V_{INB}$ is provided to the transistor 118, causing the transistor to become less conductive. The signal $V_{INB}$ is also provided to the n-type transistor 124, causing the transistor to become more conductive. As a result of the transistor 118 becoming less conductive and transistor 124 becoming more conductive, the voltage at node Z between the transistors transitions to a low-level voltage substantially equal to ground.

The signal $V_{INB}$ is also provided to the inverter 104 and the complement of $V_{INB}$ is provided as the output x1. The signal x1 is provided to the p-type transistor 122 and the n-type transistor 130. The signal x1 being substantially equal to ground causes the transistor 122 to become more conductive and the transistor 130 to become less conductive.

The low-level signal from node Z is provided to p-type transistor 120 and n-type transistor 128. The low-level signal from node Z causes transistor 120 to become more conductive, and transistor 128 to become less conductive. Therefore, transistors 120 and 122 are conductive, such that the voltage a node NZ transitions to a high-voltage level substantially equal to the first voltage reference, $V_{DDOUT}$. The high-level voltage at node NZ is provided to p-type transistor 116 and n-type transistor 126, such that transistor 116 becomes less conductive and transistor 126 becomes more conductive, driving the voltage at node Z to a low-level voltage. Thus, the voltage at node Z is set to a low-level voltage, and the voltage at node NZ is set to a high-level voltage in the $V_{DDOUT}$ voltage magnitude level.

In addition, the voltage at node NZ is provided to p-type transistor 134 and to n-type transistor 138, and the voltage at node Z is provided to p-type transistor 112 and to n-type transistor 114 of the inverter 106. The output of inverter 106 provides the complement of the voltage at node Z, such that the n-type transistor is provided with a high-level voltage signal, labeled x0. The signal $V_{INB}$ causes the transistor 132 to become less conductive and transistor 136 to become more conductive. Similarly, the voltage at node NZ causes transistor 134 to become less conductive and transistor 138 to become more conductive. The signal x0 causes transistor 140 to become more conductive. As a result of the conductivities of the transistors 132, 134, 136, 138, and 140, the output voltage $V_{OUT2}$ transitions to a low-level voltage substantially equal to ground. While the third voltage reference, $V_{DDIN}$, is powered up, transistor 142 receives a high-level voltage and becomes more conductive such that ground is provided to the second current electrode of transistor 114.

The operation of the level shifter 100 when $V_{DDIN}$ is in the active mode will now be described assuming that the input signal $V_{IN}$ is in a steady state of operation with the magnitude of the input signal $V_{IN}$ at a high-level voltage, such as $V_{DDIN}$. The high-level input signal is provided to the input terminal of the inverter 102, and the signal $V_{INB}$ is a complement of the signal $V_{IN}$ and therefore is at a low-level voltage representing a complementary logic state of the low-reference module. The signal $V_{INB}$ is provided to the transistor 118, which is a p-type transistor and as a result the transistor becomes more conductive. The signal $V_{INB}$ is also provided to the n-type transistor 124 which becomes less conductive. As a result of the transistor 118 becoming more conductive and transistor 124 becoming less conductive the node Z between the transistors transitions to indeterminate voltage level, because neither transistor 118 nor 122 provide node Z with a connection to a voltage reference.

The signal $V_{INB}$ is provided to the inverter 104 and the complement of $V_{INB}$ is provided as an output, labeled x1. The signal x1 is provided to the p-type transistor 122 and the n-type transistor 130. The signal x1 being substantially equal to $V_{DDIN}$ causes the transistor 122 to become less conductive and the transistor 130 to become more conductive, driving the voltage at node NZ to a low-level voltage.

The low-level signal from node NZ is provided to p-type transistor 116 and n-type transistor 126. The low-level signal from node NZ causes transistor 116 to become more conductive, and transistor 128 to become less conductive. Therefore, transistors 116 and 118 are conductive, such that the voltage a node Z transitions to a high-voltage level substantially equal to the first voltage reference, $V_{DDOUT}$. The high-level voltage at node Z is provided to p-type transistor 120 and n-type transistor 128, such that transistor 120 becomes less conductive and transistor 128 becomes more conductive, reinforcing that the voltage at node NZ is a low-level voltage. Thus, the voltage at node NZ is set to a low-level voltage, and the voltage at node Z is set to a high-level voltage in the $V_{DDOUT}$ voltage magnitude level.

In addition, the voltage at node NZ is provided to p-type transistor 134 and to n-type transistor 138, and the voltage at node Z is provided to p-type transistor 112 and to n-type transistor 114 of the inverter 106. The output of inverter 106 provides the complement of the voltage at node Z, such that the n-type transistor is provided with a low-level voltage x0. The signal $V_{INB}$ causes the transistor 132 to become more conductive and transistor 136 to become less conductive. Similarly, the voltage at node NZ causes transistor 134 to become more conductive and transistor 138 to become less conductive. The signal x0 causes transistor 140 to become less conductive. As a result of the conductivities of the transistors 132, 134, 136, 138, and 140, the output voltage $V_{OUT2}$ transitions to a high-level voltage substantially equal to $V_{DDOUT}$.

When the $V_{DDIN}$ voltage domain is placed in the a low-power mode, it is assumed for purposes of discussion that the reference voltage $V_{DDOUT}$ remains at a high-level voltage and the third voltage reference $V_{DDIN}$ is set to a low-level voltage substantially equal to ground. While $V_{DDIN}$ is set to the low-level voltage transistors 126 and 128 provide assistance to set the voltages at nodes Z and NZ to determinate voltages. This can be better understood by illustrating the operation of the digital level shifter 100 without the transistors 126 and 128. In particular, without the transistors 126 and 128, when $V_{DDIN}$ is in the low-power state the inverters 102 and 104 provide a low-level voltage at their respective outputs, regardless of their respective input voltages. Thus, in the low-power mode $V_{INB}$ and x1 are both low-level voltages substantially equal to ground. The signal $V_{INB}$ is provided to the transistor 118, increasing the conductivity of the transistor. The signal $V_{INB}$ is also provided to the n-type transistor 124, decreasing the conductivity of the transistor. Further, the signal x1 being substantially equal to ground causes the transistor 122 to become more conductive and the transistor 130 to become less conductive. The voltages at nodes Z and NZ are therefore indeterminate. The output voltage $V_{OUT2}$ will therefore depend on the difference between the leakage current of the transistors 124 and 130 and the leakage current of the transistors 116 and 120. For example, if the pmos transistors 116 and 120 leak more than the nmos transistors 124 and 130, the output will drift to a high-level voltage output, while if the nmos transistors leak 124 and 130, the output can drift to a low-level voltage output. Thus, in the low-power mode, the output voltage would be unpredictable. This unpredictability can make the level shifter, and the device including the level shifter, difficult to test, and can undesirably impact operational behavior of the device. For example, a voltage and current spike can occur as the reference voltage $V_{DDIN}$ is powered on and the output voltage $V_{OUT2}$ is set based on the input voltage.

The configuration of the transistors 126 and 128 assist in setting the output voltage of the level shifter 100 to a determinate level when VDDIN is in a low-power mode. In particular the size and other characteristics of transistor 126 and 128 are set such that one the nodes Z and NZ are driven to a determinate voltage. To illustrate, in one embodiment the transistor 126 is configured to be larger than the transistor 128, such that more current is needed across the transistor to make transistor 126 conductive. Therefore, as the voltage at node NZ is applied to the control electrode of transistor 126 and the voltage at node Z is applied to the control electrode of transistor 128, more current is drawn through the transistor 126 than transistor 128. As more current is drawn through transistor 126, the voltage drop across the transistor increases and the voltage at node Z also increases to substantially equal the voltage drop across the transistor. The increase in voltage at node Z is causes the current drawn across the transistor 128 to decrease, so that the voltage drop across the transistor also decreases. The decrease in the voltage drop across transistor 128 causes the voltage at node NZ to decrease.

The voltage at node Z is also applied to transistor 120 and the voltage at node NZ is also applied to transistor 116. The decrease voltage at node NZ causes transistor 116 to be more conductive, which in turn pulls the voltage at node Z to a higher voltage level that is approaching $V_{DDOUT}$. At substantially the same time, the increase voltage at node Z causes transistor 120 to become less conductive and transistor 128 to become more conductive, which in turn decreases the voltage at node NZ. The increase of the voltage at node Z and the decrease of the voltage at node NZ continue until the voltage at node Z is substantially equal to $V_{DDOUT}$ and the voltage at node NZ is substantially equal to ground. The voltage at node NZ and the signal $V_{INB}$ both being substantially equal to ground causes the output signal $V_{OUT2}$ to equal $V_{DDOUT}$. Thus, transistors 126 and 128 cause the output signal $V_{OUT2}$ to be determinative and predictable.

The configuration of the transistors 132, 134, 136, 138, 140, 112, and 114 assist in equalizing the rise-time slew rate and the fall-time slew rate of the level shifter 100. To illustrate, it is assumed that the amount of time required for the digital level shifter 100 to transition the output voltage $V_{OUT2}$ from a low-level voltage to a high-level voltage is a rise time slew rate. Similarly, the amount of time required for the digital level shifter 100 to transition the output voltage $V_{OUT2}$ from a high-level voltage to a low-level voltage is a fall time slew rate. The operation of the transistors 132, 134, 136, 138, 140, 112, and 114 can be better understood by describing the operation of the digital level shifter 100 without these transistors. In particular, without the transistors 132, 134, 136, 138, 140, 112, and 114, the output voltage $V_{OUT2}$ is based on the inverse of the voltage at node NZ, It is further assumed in this configuration that the voltage at node NZ is provided to an inverter in order to set the output voltage to the appropriate polarity. The rise time slew rate is affected by the amount of time required for the transistor 130 to become conductive and to provide node NZ with a direct connection to the ground voltage reference, and the fall time slew rate is affected by the amount of time required for the transistors 120 and 122 to become conductive and to provide node NZ with a direct connection to the $V_{DDOUT}$ voltage reference.

As the input signal $V_{IN}$ transitions from a low-level voltage to a high-level voltage, the signal $V_{INB}$ transitions from a high-level voltage to a low-level voltage and the signal x1 transitions from a low-level voltage to a high-level voltage. The signal x1 causes the n-type transistor 130 to become more conductive and the voltage at node NZ to transition to a low-level voltage. Thus, the output voltage $V_{OUT2}$ transitions to a high-level voltage at an associated rise time slew rate.

As the input signal $V_{IN}$ transitions from a high-level voltage to a low-level voltage, the signal $V_{INB}$ transitions from a low-level voltage to a high-level voltage, and the signal x1 transitions to a low-level voltage. The signal x1 causes the p-type transistor 122 to become more conductive and the n-type transistor 130 to become less conductive. However, transistor 120 does not immediately become more conductive, and as a result node NZ is not provided with a connection to a voltage reference until transistor 120 becomes conductive. Upon transistor 120 becoming conductive, the voltage at node NZ is set to VDDOUT and the output voltage VOUT2 is set to ground. Thus, the rise-time slew rate is primarily dependent upon the switching of the transistor 130. The fall-time slew rate is primarily dependent on switching of the transistors 120 and 122. Because the transistors and 122 are likely to be of a different size than the transistor 130, the rate at which each transistor switches is likely to be different. Therefore, the fall time slew rate is likely to be different than the rise time slew rate. Further, the variation in rise-time and fall-time slew rate in this configuration can vary substantially as the ratio between the voltage levels of $V_{DDIN}$ and $V_{DDOUT}$ vary. This variation can impact modules downstream of the level shifter.

The transistors 132, 134 136, 138, 140, 112, and 114 assist in equalizing the rise-time and fall-time slew rates of the level shifter 100. In particular, with the transistors 132, 134, 136, 138, 140, 112, and 114, the rise time slew rate is based primarily on the rate at which the transistors 132 and 134 to become conductive and thereby provide the output terminal with a direct connection to the $V_{DDOUT}$ voltage rail, and the fall time slew rate is primarily based on the rate at which the transistors 136, 138, and 140 become conductive and to provide the output terminal with a direct connection to the ground voltage rail.

To illustrate, as the input signal $V_{IN}$ transitions from a low-level voltage to a high-level voltage, the signal $V_{INB}$ transitions from a high-level voltage to a low-level voltage and the signal x1 transitions from a low-level voltage to a high-level voltage. The signal x1 causes the n-type transistor 130 to become more conductive and the voltage at node NZ to transition to a low-level voltage. Therefore, at substantially the same time as the input signal $V_{IN}$ transitions to a high-level voltage, transistor 132 receives the low-level voltage of the signal $V_{INB}$ and the transistor 134 receives the low-level voltage of node NZ. Thus, transistors 132 and 134 become more conductive and provide the output terminal with a direct connection to the first voltage reference, $V_{DDOUT}$. Transistor 136 also receives the low-level voltage of the signal $V_{INB}$ and the transistor 138 receives the low-level voltage of node NZ. Transistors 136 and 138 become less conductive to prevent the output terminal from having a direct connection with the second voltage reference, ground.

As the input signal $V_{IN}$ transitions from a high-level voltage to a low-level voltage, the signal $V_{INB}$ transitions from a low-level voltage to a high-level voltage. The signal $V_{INB}$ causes the n-type transistor 124 to become more conductive and the voltage at node Z to transition to a low-level voltage. The inverter 106 receives the low-level voltage of node Z and provides the high-level voltage signal x0 to the transistor 140. Therefore, at substantially the same time as the input signal $V_{IN}$ transitions to a low-level voltage, transistor 136 receives the high-level voltage of the signal $V_{INB}$ and the transistor 140 receives the high-level voltage of signal x0. Thus, transistors 136 and 140 become more conductive and provide the output terminal with a direct connection to the second voltage reference, ground. Transistor 132 also receives the high-level voltage of the signal $V_{INB}$, such that the transistor becomes less conductive to prevent the output terminal from having a direct connection with the first voltage reference, $V_{DDOUT}$.

Further, it is assumed that the size ratios between the P-type and N-type transistors are set in such a way as determined by process technology beta ratio. The rise and fall time slew rates of $V_{OUT}$ are equalized by equalizing the number of gate delays between the input signal $V_{IN}$ and the transistors 132, 134, 136, 138, and 140. For purposes of discussion, these transistors are referred to as the transistors of the output driver.

To illustrate, transistors 116, 118, 124, and 126 are, for purposes of discussion, grouped together to form "gate A" as illustrated in FIG. 1, and transistors 120, 122, 128, and 130 are, for purposes of discussion, grouped together to form "gate B." Other gates for the purpose of determining gate delays from $V_{IN}$ to each of the transistors in the output driver are inverters 102, 104, and 106. Thus, between the input that receives the signal $V_{IN}$ to the node that provides the signal $V_{INB}$ there is one gate delay, the inverter 102. From $V_{IN}$ to NZ the minimum gate delay is three, composed of either inverter 102, inverter 104, and gate B, or inverter 102, gate A, and gate B. From $V_{IN}$ to x0, there are three gate delays, inverters 102, 104, and 106.

Transistors 132 and 134 determine a logic high transition at $V_{OUT2}$. The gate delay associated with transistor 132 is one, the gate delay associated with $V_{INB}$. The gate delay associated with transistor 134 is three, the gate delay associated with NZ. In addition, because transistors 132 and 134 are arranged in series, the transitioning of $V_{OUT2}$ to logic high, $V_{DDOUT}$, is limited by the three gate delays associated with transistor 134.

Transistors 136, 138, and 140 determine the transitioning of $V_{OUT2}$ to a logic low. The earliest arrival between transistors 136 and 138, referred to for purposes of discussion as "arrival A", and the latest arrival between arrival A and x0 determine the transition low of $V_{OUT2}$. There is one gate delay for arrival A and three gate delays to x0, therefore x0 limits the logic low transition. The limiting transistors for the output driver are therefore transistor 134 for the rise time slew rate and transistor 140 for the fall time slew rate. As stated above, the gate delay associated with transistor 134 is three and the gate delay associated with transistor 140 is also three. Since the number of gate delays for the limiting transistors 134 and 140 are the same, the rise and fall time slew rates of the output driver are substantially equal. Furthermore, the topology of the output driver is arranged in such a way that the limiting transistors 134 and 140 are driven in such a way to assure full conductivity without a DC current.

Figure 2:
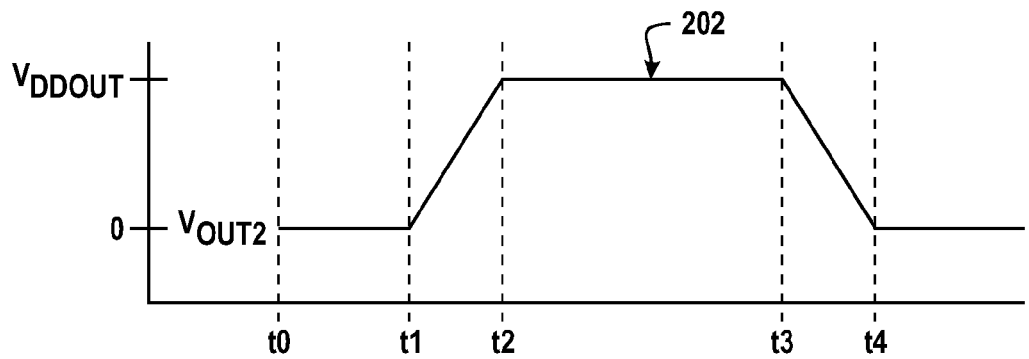
FIG. 2 is a waveform illustrating a particular embodiment of a signal waveform of the output voltage of the level shifter of FIG. 1.

FIG. 2 shows a waveform 202 for an output signal from the level shifter 100. During the time periods t0 to t1 and t4 to t5 the input signal $V_{IN}$ is a steady-state low-level voltage as described above with FIG. 1 and the output signal $V_{OUT2}$ is a low-level signal, substantially equal to ground. Similarly, during the time period t2 to t3 the input signal is a steady-state high-level voltage with a magnitude substantially equal to $V_{DDIN}$ as described above with FIG. 1 and the output signal is a high-level signal with a magnitude substantially equal to $V_{DDOUT}$. During the transition periods t1 to t2 and t3 to t4 of the output voltage the conductivity of the transistors 116, 118, 120, 122, 124, 126, 128, 130, 132, 134, 136, and 138 in the level shifter 100 change at different rates based on the signal provided to each of the transistors. The conductivity rate of change affects the rise time slew rate and fall time slew rate of the output signal $V_{OUT2}$.

The amount of time required for $V_{OUT2}$ to transition from a low-level voltage, at t1, to a high-level voltage, at t2, is referred to as a rise time slew rate. During the time period t1 to t2, the input signal $V_{IN}$ transitions from a low-level signal to a high-level signal, the signal $V_{INB}$ transitions from a high-level signal to a low-level signal, and the signal x1 transitions from a low-level signal to a high-level signal. Thus, the conductivity of the n-type transistor 130 increases more rapidly as compared to the conductivity of the n-type transistor 128, such that the voltage at node NZ quickly transitions to a low-level voltage, substantially equal to ground. At this point the voltage at node Z transitions substantially slower than the voltage at node NZ because the transistors 118 and 124 do not provide node Z with a direct connection to a voltage rail and transistor 130 does provide node NZ with a direct connection to the ground voltage rail. The signal $V_{INB}$ is a low-level voltage, and the voltage at node NZ is also a low-level voltage, which causes the p-type transistors 132 and 134 to become more conductive, and the n-type transistors 136 and 138 to become less conductive. Therefore, the output $V_{OUT2}$ transitions to a high-level voltage, $V_{DDOUT}$, at t2.

At t3, the input signal $V_{IN}$ transitions from a high-level voltage to a low-level voltage, as a result the signal $V_{INB}$ transitions from a low-level voltage to a high-level voltage and the signal x1 transitions from a high-level voltage to a low-level voltage. The $V_{INB}$ signal is provided to the p-type transistor 118 and the n-type transistors, such that the transistor 118 becomes less conductive and the transistor 124 becomes more conductive. Thus, the voltage at node Z transitions to a low-level voltage, such as ground, substantially faster than the voltage at node NZ transitions to a high-level voltage. The low-level voltage at node Z is also provided to the inverter 106, such that the signal x0 is a high-level voltage, substantially equal to $V_{DDOUT}$. Therefore, the n-type transistors 136 and 140 are provided with high-level voltages so that the transistors become more conductive, and the voltage at $V_{OUT2}$ transitions to a low-level voltage by t4. The amount of time required for $V_{OUT2}$ to transition from a high-level voltage, at t3, to a low-level voltage, at t4, is referred to as a fall time slew rate. The rise time slew rate is preferably substantially equal to the fall time slew rate.

For example, the digital level shifter 100 can be configured to provide a periodic digital waveform, such as a clock signal, with a substantially 50% duty cycle. If the rise and fall time of the digital level shifter 100 is not equal, the duty cycle can be distorted. For example, the duty cycle could be distorted by 10% which results in a 60%/40% duty cycle waveform. Depending on the application of the digital level shifter 100, the distorted signal may be undesirable. Thus, by equalizing the rise time and fall time slew rates, the output signal of the digital level shifter 100 can more closely match a defined waveform. Further, the configuration of the digital level shifter 100 can reduce duty cycle distortion over a wide range of $V_{DDIN}$ to $V_{DDOUT}$ ratios.

Figure 3:
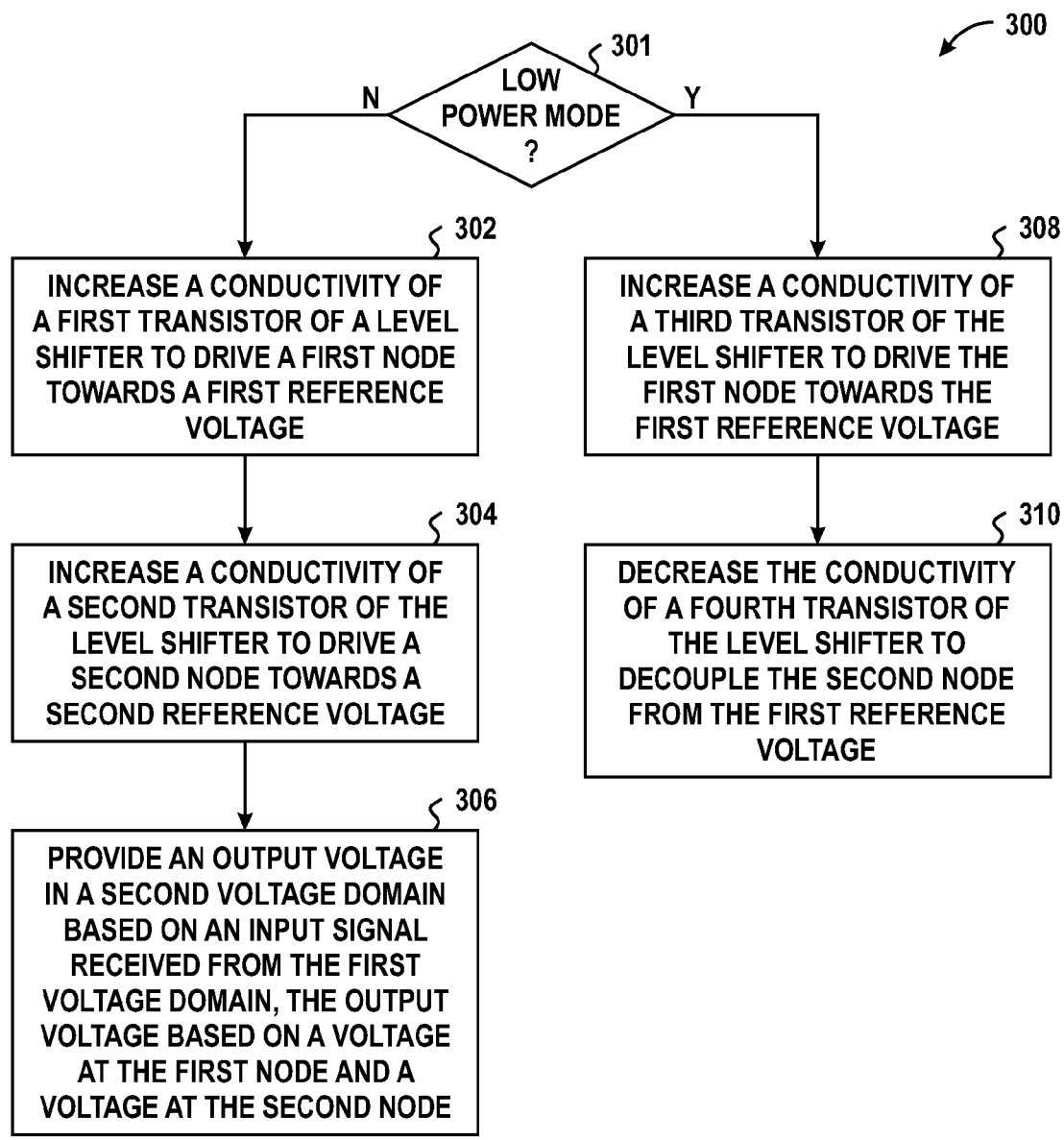
FIG. 3 is a flow diagram of a method for providing an output voltage in the level shifter of FIG. 1.

FIG. 3 shows a flow diagram of a method 300 for providing an output voltage in the level shifter 100 of FIG. 1. At block 301, it is determined if a first voltage domain, such as the $V_{DDIN}$ voltage domain of FIG. 1, is in a low power mode. If not, at block 302 a conductivity of a first transistor of a level shifter is increased to drive a first node towards a first reference voltage. A conductivity of a second transistor of the level shifter is increased to drive a second node towards a second reference voltage at block 304. At block 306, an output voltage is provided in a second voltage domain based on an input signal received from the first voltage domain. The output voltage is based on a voltage at the first node and a voltage at the second node.

If, at block 301, the first voltage domain is in a low power mode, the method flow proceeds to block 308 and the conductivity of a third transistor of the level shifter is increased to drive the first node towards the first reference voltage. The conductivity of a fourth transistor is decreased to decouple the second node from the first reference voltage at block 310. This provides a determinate output at the output node of the level shifter, reducing the likelihood of undesirable current spikes and other output signal perturbations.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device, comprising:
    a first transistor of a first conductivity type comprising a first current electrode coupled to a first voltage reference, a second current electrode, and a control electrode;
    a second transistor of a second conductivity type comprising a first current electrode coupled to the second current electrode of the first transistor and configured to provide a first output signal, a second current electrode coupled to a second voltage reference, and a control electrode configured to receive a first input signal;
    a third transistor of the second conductivity type comprising a first current electrode coupled to the first current electrode of the second transistor, a second current electrode coupled to the second voltage reference, and a control electrode coupled to the control electrode of the first transistor;
    a fourth transistor of the first conductivity type comprising a first current electrode coupled to the first voltage reference, a second current electrode, and a control electrode coupled to the first current electrode of the second transistor;
    a fifth transistor of the second conductivity type comprising a first current electrode coupled to the second current electrode of the fourth transistor and to the control electrode of the first and third transistors and configured to provide a second output signal, a second current electrode coupled to the second voltage reference, and a control electrode configured to receive a second input signal;
    a sixth transistor of the second conductivity type comprising a first current electrode coupled to the first current electrode of the fifth transistor, a second current electrode coupled to the second voltage reference, and a control electrode coupled to the first current electrodes of the second transistor and to the control electrode of the fourth transistor;
    a seventh transistor of the first conductivity type comprising a first current electrode coupled to the first voltage reference, a second current electrode configured to provide a third output, and a control electrode coupled to the first current electrode of the second transistor;
    an eighth transistor of the second conductivity type comprising a first current electrode coupled to the second current electrode of the seventh transistor, a second current electrode, and a control electrode coupled to the control electrode of the seventh transistor;
    a ninth transistor of the first conductivity type coupled between the first transistor and the second transistor and comprising a first current electrode coupled to the second current electrode of the first transistor, a second current electrode coupled to the first current electrode of the second transistor, and a control electrode configured to receive the first input signal;
    a tenth transistor of the first conductivity type coupled between the fourth transistor and the fifth transistor and comprising a first current electrode coupled to the second current electrode of the fourth transistor, a second current electrode coupled to the first current electrode of the fifth transistor, and a control electrode configured to receive the second input signal;
    an eleventh transistor of the first conductivity type comprising a first current electrode coupled the first voltage reference, a second current electrode, and a control electrode configured to receive the first input signal;
    a twelfth transistor of the first conductivity type comprising a first current electrode coupled to the second current electrode of the eleventh transistor, a second current electrode, and a control electrode coupled to the first current electrode of the fifth transistor;
    a thirteenth transistor of the second conductivity type comprising a first current electrode coupled the second current electrode of the twelfth transistor, a second current electrode configured to provide a fourth output signal, and a control electrode configured to receive the first input signal; and
    a fourteenth transistor of the second conductivity type comprising a first current electrode coupled the second current electrode of the thirteenth transistor, a second current electrode coupled to the second voltage reference, and a control electrode coupled to the first current electrode of the eighth transistor.

2. The device of claim 1 further comprising:
a fifteenth transistor of the second conductivity type comprising a first current electrode coupled the first current electrode of the thirteenth transistor, a second current electrode coupled to the second current electrode of the thirteenth transistor, and a control electrode coupled to the first current electrode of the fifth transistor.

3. The device of claim 2 further comprising:
a sixteenth transistor of the second conductivity type comprising a first current electrode coupled to the second current electrode of the eighth transistor, a second current electrode coupled to the second voltage reference, and a control electrode coupled to a third voltage reference.

4. A device comprising:
a pair of cross coupled inverters including:
  a first inverter having a first input terminal for receiving a first input signal, and a first output terminal; and
  a second inverter having a second input terminal coupled to the first output terminal of the first inverter and for receiving a second input signal, and a second output terminal coupled to the first input terminal of the first inverter;
a first transistor of a first conductivity type comprising a first current electrode coupled the first voltage reference, a second current electrode, and a control electrode configured to receive the first input signal;
a second transistor of the first conductivity type comprising a first current electrode coupled to the second current electrode of the first transistor, a second current electrode, and a control electrode coupled to the second output terminal of the pair of cross coupled inverters;
a third transistor of a second conductivity type comprising a first current electrode coupled the second current electrode of the second transistor, a second current electrode configured to provide an output signal, and a control electrode configured to receive the first input signal; and
a fourth transistor of the second conductivity type comprising a first current electrode coupled the second current electrode of the third transistor, a second current electrode coupled to a second voltage reference, and a control electrode.

5. The device of claim 4 further comprising:
a fifth transistor of the second conductivity type comprising a first current electrode coupled the first current electrode of the third transistor, a second current electrode coupled to the second current electrode of the third transistor, and a control electrode coupled to the second output terminal of the pair of cross coupled inverters.

6. The device of claim 5 further comprising:
a sixth transistor of the first conductivity type comprising a first current electrode coupled to the first voltage reference, a second current electrode coupled to the current electrode of the fourth transistor, and a control electrode coupled to the first output terminal of the cross coupled pair of inverters; and
a seventh transistor of the second conductivity type comprising a first current electrode coupled to the second current electrode of the sixth transistor, a second current electrode, and a control electrode coupled to the control electrode of the sixth transistor.

7. The device of claim 4 wherein the first input signal has a maximum specified voltage substantially different than a magnitude of the first voltage reference.

8. The device of claim 4 wherein the first conductivity type is p-type conductivity.

9. The device of claim 4 wherein the second conductivity type is n-type conductivity.

10. A method comprising:
in response to a first voltage domain being in a first mode:
  increasing a conductivity of a first transistor of a level shifter to drive a first node towards a first reference voltage;
  increasing a conductivity of a second transistor of the level shifter to drive a second node towards a second reference voltage; and
  providing an output voltage in a second voltage domain based on an input signal received from the first voltage domain, the output voltage based on a voltage at the first node and a voltage at the second node; and
in response to the first voltage domain being in a second mode;
  increasing the conductivity of a third transistor of the level shifter to drive the first node towards the first reference voltage;
  decreasing the conductivity of a fourth transistor of the level shifter to decouple the second node from the first reference voltage.

11. The method of claim 10, wherein providing the output voltage comprises providing a periodic output signal having a rise-time slew rate substantially equal to a fall-time slew rate.

12. The method of claim 11, wherein the periodic output signal comprises a clock signal.

* * * * *